United States Patent
Dent

(10) Patent No.: US 6,484,285 B1
(45) Date of Patent: Nov. 19, 2002

(54) TAILBITING DECODER AND METHOD

(75) Inventor: Paul W. Dent, Pittsboro, NC (US)

(73) Assignee: Ericsson, Inc., Research Triangle Park, NC (US)

( * ) Notice: Subject to any disclaimer, the term of this patent is extended or adjusted under 35 U.S.C. 154(b) by 0 days.

(21) Appl. No.: 09/499,600

(22) Filed: Feb. 7, 2000

(51) Int. Cl.$^7$ ............................................. H03M 13/00
(52) U.S. Cl. ........................................ 714/791; 375/341
(58) Field of Search ................................. 714/786, 791, 714/792, 794–796; 75/265, 341

(56) References Cited

U.S. PATENT DOCUMENTS

| | | | | |
|---|---|---|---|---|
| 4,532,636 A | | 7/1985 | Wilkinson | 375/136 |
| 4,797,887 A | | 1/1989 | Yamasaki | 714/791 |
| 5,099,499 A | | 3/1992 | Hammar | 375/341 |
| 5,164,961 A | | 11/1992 | Gudmundson | 375/229 |
| 5,335,250 A | | 8/1994 | Dent et al. | 375/224 |
| 5,349,589 A | | 9/1994 | Chennakeshu et al. | 714/795 |
| 5,557,645 A | | 9/1996 | Dent | 375/340 |
| 5,568,518 A | | 10/1996 | Dent | 375/340 |
| 5,577,053 A | | 11/1996 | Dent | 714/755 |
| 5,615,231 A | | 3/1997 | Dent | 375/340 |
| 5,619,533 A | | 4/1997 | Dent | 375/232 |
| 5,646,963 A | | 7/1997 | Dent | 375/340 |
| 5,721,746 A | * | 2/1998 | Hiadik et al. | 714/786 |
| 5,790,606 A | | 8/1998 | Dent | 375/348 |
| 5,920,597 A | * | 7/1999 | Khayrallah et al. | 375/265 |
| 5,944,774 A | | 8/1999 | Dent | 708/517 |
| 5,974,091 A | * | 10/1999 | Huff | 375/265 |
| 6,012,160 A | | 1/2000 | Dent | 714/786 |
| 6,088,405 A | * | 7/2000 | Hladik et al. | 375/341 |
| 6,192,501 B1 | * | 2/2001 | Hladik et al. | 714/786 |
| 6,275,538 B1 | * | 8/2001 | Ramesh et al. | 375/265 |

FOREIGN PATENT DOCUMENTS

| | | | |
|---|---|---|---|
| EP | 0 611 098 A2 | 8/1994 | |
| EP | 1 001 543 A1 | 5/2000 | |
| WO | WO99/60739 A1 | 11/1999 | |
| WO | WO 99/63673 A1 | 12/1999 | |

OTHER PUBLICATIONS

Anderson et al., Tailbiting MAP Decoder, IEEE, pp. 297–302, Feb. 1998.*

Sadowsky, An Efficient List Viterbi Algorithm with Applicati9on to ML Decoding of Turbo Codes, Department of EE Arizona State University, pp. 1–27, 1998.*

(List continued on next page.)

Primary Examiner—Albert Decady
Assistant Examiner—Shelly A Chase
(74) Attorney, Agent, or Firm—Moore & Van Allen, PLLC; Gregory Stephens

(57) ABSTRACT

An apparatus and method decode information signals which have been encoded using a tailbiting error-correction codeword. The method generally includes the steps of initializing a number of decoder states corresponding to all possible starting states of the encoder to have equal associated likelihood metrics. The metrics are updated to reflect a likelihood metric for each of the decoder states given the received information signals. Further information signals, representative of further coded symbols, are received and a decoder state having the highest associated likelihood metric is extended by updating the likelihood metric to produce new likelihood metrics for each possible hypothesized extended decoded information symbol, given the further received information signals. An assumed value for the extended decoder information symbol is appended to the symbol history for the extended decoder state. The method continues to receive further information signals and to extend the decoder state having the highest likelihood metric by hypothesizing additional information symbols to produce extended decoder states until a last information symbol coded in the tailbiting codeword has been hypothesized. Final metrics are computed for each of the corresponding extended decoder states and if one of the final metrics is indicative of the highest likelihood metric, then the symbol history of the associated decoder state is used as the decoded information.

18 Claims, 7 Drawing Sheets

OTHER PUBLICATIONS

Wang et al., An Efficeint Maximum likelihood Decoding Algorithm for Generalized Tail Biting Convolutional Codes including Quasicyclic codes, IEEE, pp. 875–879, 1989.*

Gould et al., Single–Chip Design of Bit–Error–Correcting Stack Decoders, IEEE, pp. 768–775, May 1992.*

Orten, P., "Sequential Decoding of Tailbitimg Convolutional Codes for Hybrid ARQ on Wireless Channels", Houston, TX, May 16–20, 1999 New York, NY: IEEE, US vol. CONF 49, May 16, 1999, pp. 279–284, XP000899240 (all pages relevant).

Zimmerman, G., et al., "Application of a Simplified Fano Metric to Adaptive Receivers for Digital Mobile Radio Systems," *European Transactions on Telecom. and Related Tech.*, May/Jun. 1994.

Cox, R., et al., "An Efficient Adaptive Circular Viterbi Algorithm for Decoding Generalized Tailbiting Convolutional Codes," *IEEE Transactions on Vehicular Technology*, vol. 43, No. 1, Feb., 1994.

* cited by examiner

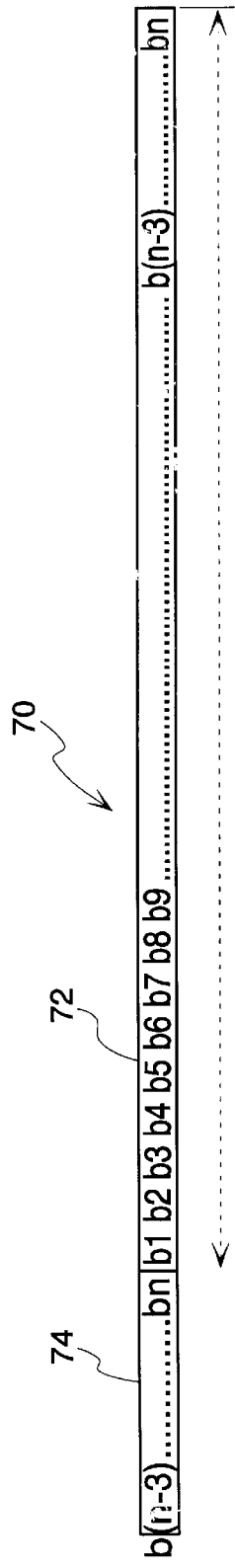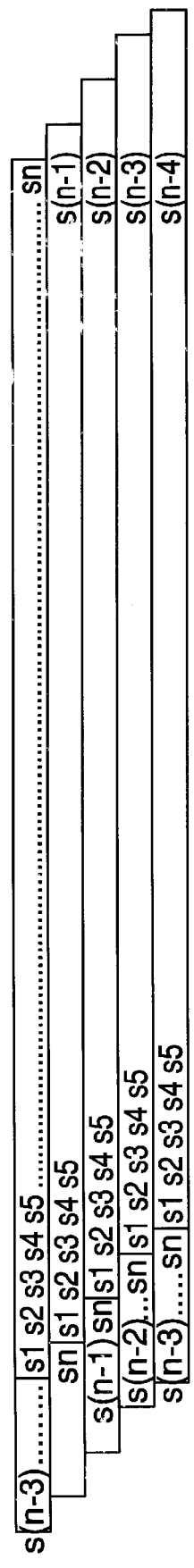

TAILBITING DECODER AND METHOD

FIELD OF THE INVENTION

The present invention is directed toward a method for decoding information signals and, more particularly, toward a method for decoding information signals that have been error-correction coded in cyclic blocks and/or have been received through a medium that introduces Inter-Symbol Interference (ISI), such block-cyclic decoders generally referred to as tailbiting decoders.

BACKGROUND OF THE INVENTION

FIG. 1 illustrates in path form a prior art Stack decoding method, implemented by a prior art Stack decoder, for decoding continuously convolutionally coded signals. The method is described for steady-state operation after the Stack decoder has been operating for a relatively long time in relation to any special start-up operations. At the instant depicted in FIG. 1, the Stack decoder has tested a number of possible sequences represented by paths moving from left to right one symbol, or node, at a time. Every time a path is extended by one symbol, all possible values of the new symbol have to be considered, resulting in a new fork. If the symbols are binary symbols, or bits, that can take on only one of two values, then the forks each have two times corresponding to the next binary symbol being either a "1" or a "0". At each node just before a new fork is generated, a number of numerical quantities are stored in a memory (not shown) associated with the node. The quantities describe at least the path, or symbol history, by which the Stack decoder reached the node, and a cumulative probability value for that path.

For example, two probability values are depicted in FIG. 1, namely, a value P1 attached to a node 10 of highest probability, and a valve P2 attached to a node 12 of second highest probability. The description of the path can, for example, be a string of symbols representing which of the previous forks were taken to reach the current node plus the probability at the current node. Accordingly, at the node 10 the description may include the symbol string . . . 010101 and the probability value P1, while at the node 12 the description may include the symbol string . . . 00 and the probability value P2. Alternatively, the description can include the symbol corresponding to the last fork taken, plus a pointer to the preceding node at which that fork was taken. The latter is sometimes more memory-efficient as only one symbol need be stored at each node. If it is desired to reproduce the string of symbols along the path, a "trace-back" operation may then be performed.

The prior art Stack algorithm shown in FIG. 1 proceeds by extending the path of highest probability by one symbol and re-evaluating the probabilities for the extended paths. The path is extended by creating two new branches (in the case of binary symbols) from the previous node 10 of highest probability (P1). The two new branches are represented by dashed lines in FIG. 1 and end in two new nodes 14 and 16 for which new probability values xP1 and yP1 are respectively calculated. The sum of the multipliers (x+y) does not equal unity because the particular path chosen to be extended may be incorrect. The result of a trial-extension of an erroneous path may thus provide further evidence that the erroneous path was incorrect, reducing the probability of the path from P1 to (x+y)P1. Multiplying this reduced path probability by the conditional branch probabilities x/(x+y) and y/(x+y), which do sum to unity, the probability for the two extended nodes xP1 and yP1 are obtained. The new probabilities xP1 and yP1 are then compared to the probabilities of other paths, particularly to the previous second highest probability P2, and to each other, to determine the node now having the highest probability which will be the next node extended to become two new nodes, and so forth.

Since multiplying the probability P1 by x and y, respectively, both of which must be less than unity, can only reduce the probability below P1, it often happens in the prior art Stack algorithm that the previously second highest probability P2 becomes the highest. When the node 12 having the probability P2 is extended instead of one of the new nodes 14 (xP1) or 16 (yP1), this is termed "backtracking", as the relative probabilities provide a hint that the path passing through the node 10 (P1) may not have been the correct path, and that decoding should perhaps be resumed along a previously abandoned path. Noise is one of the factors which may lead a Stack decoder astray along an incorrect path.

It is a disadvantage of the prior art Stack algorithm that, under noisy conditions, much backtracking takes place with a consequent increase in processing. The prior art Stack algorithm suffers from the deficiency that backtracking to any previously abandoned node, however far back (e.g., 10, 50, 100 or even 1,000 bits), could in principle occur, leading to the amount of computation required to determine the best path being unbounded. Consequently there is a need for improved Stack algorithms that do not suffer to the same extent from this deficiency.

In the prior art, the Stack algorithm was envisaged for continuous decoding, such as continuous convolutional decoding. However, as has been mentioned in the prior art, for example in "Error Control Coding" by Lin & Costello, (ISBN 0-13-283796-X), tail bits can be appended to a block of data prior to coding, the extra tail bits being transmitted so that the Stack decoder can end in a definitive end state. The use of tail bits adds additional redundancy and overhead to the transmission, causing the beginning and end bits to exhibit an improved error rate relative to bits in the middle of the transmission. This, however, may be of no utility since a lower error rate on all bits may be preferred, or alternatively, a transmission with lower overhead and therefore narrower bandwidth may also be preferred.

In a prior art decoding algorithm known as the Viterbi algorithm, the probability-indicating values are known as metrics. Because the Viterbi algorithm only compares probabilities for paths of the same length in symbols, indeterminate constants that add to, or multiply, the metrics do not affect the comparison, as they affect all paths alike. The Viterbi decoder can thus use simplified metrics which are the cumulative squared errors between hypothesized symbol coded values and received coded values. These simplified metrics are known as Euclidean distance metrics and are related to the logarithm of the reciprocal of the probability for the symbol sequence.

In the Stack algorithm, however, paths of different lengths must be compared, and the comparison is not then immune to additive terms that depend on the path length. Various methods are known to construct metrics for the Stack and similar algorithms that compare paths of different length. These metrics are generally Viterbi-type Euclidean-distance metrics modified by subtracting a value from the metric of a path every time the path is extended by one symbol. One such metric is known as the Fano metric which subtracts a value from the metric representative of the estimated mean square noise that is expected to be added per symbol extension, even to a correct path.

The present invention is directed toward overcoming one or more of the above-mentioned problems.

SUMMARY OF THE INVENTION

In a first embodiment of the present invention, a block of information symbols to be transmitted is generally regarded as a closed circle of information symbols. A coding algorithm is applied to the symbols lying in a segment of the circle to generate groups of coded symbols for each successive position of the segment, as the segment is moved around the circle one information symbol at a time. The groups of coded symbols are regarded as a closed circle of coded symbols corresponding to the closed circle of information symbols. The coded symbols are transmitted over a channel subject to error-inducing noise or other interference. This method of circular encoding is generally known as tailbiting.

A tailbiting, or Stack decoder according to the present invention receives the noisy signal and decodes it to reproduce the information symbol circle originally transmitted. The Stack decoder postulates information symbol sequences starting at any position around the circle, calculates likelihoods for the postulated symbol sequences by combining each sequence with corresponding soft-demodulated symbols, and extends the most probable sequence one symbol at a time until it either ceases to be the most probable sequence of those sequences tested, or until it extends completely around the circle. A sequence which successfully extends around the complete circle, and which remains the most probable sequence of those tested when the circle is complete, is the global optimum decoded sequence of the received signal. This is in contrast to prior art tailbiting Viterbi algorithms in which the most probable sequence among those sequences tested is not necessarily the global optimum.

In a second embodiment of the present invention, a coded or uncoded information symbol, or cyclic, block is modulated to form a transmitted signal block that is received at the decoder via a channel that introduces Inter-Symbol Interference (ISI). If desired, the inclusion of a short cyclic repeat of the transmitted signal by repeating a limited number of last-transmitted symbols of the block prior to the start of the transmitted signal block, or alternatively repeating a limited number of the first-transmitted symbols at the end of the block, or both, can force the ISI pattern to appear cyclic.

An inventive equalizing method for such signals includes postulating transmitted symbol sequences starting at any position within a cyclic block and calculating probabilities for the postulated sequences by combining the postulated symbols with the received signal. The most probable sequence is then extended successively by one symbol around the cyclic block until either it ceases to be the most probable sequence, or until the sequence extends completely around the cyclic block. A sequence which extends completely around the cyclic block while at the end still having the highest probability of all sequences tested is the global optimum equalization of the received signal. In this second embodiment of the invention, a tailbiting Viterbi equalizer may be used.

The inventive tailbiting Stack Algorithm used by the Stack decoder extends postulated sequences until the last symbol appended is the last symbol in the circle not previously postulated and adjacent to the first symbol postulated. There then remains a number L−1 of shifts of the decoding algorithm around the circle before it is once more in its starting position, where L corresponds to the constraint length of the encoder polynomials or the delay spread, in symbol periods, of a multipath channel. These L−1 final shifts are made to complete the likelihood calculation for the sequence and to use the remainder of the received signal samples, or soft-demodulated symbols, in the cycle that have not yet been processed. Once the last symbol in the circle is reached, the probability is updated L times in succession using previous values for the first L−1 symbols to obtain a "final" probability, or likelihood value, for the sequence. If the final probability value is still the highest probability value of all sequences tested, it is the global optimum decoded sequence and no other partial sequences need be extended. If not, the partial sequences having a higher probability are successively extended either until their probabilities fall below the already completed sequence of highest likelihood, or else until one of them becomes a complete circular sequence with a final probability that is greater than all other probabilities. Whenever a circular sequence is completed, all partial sequences having lower probabilities may be expunged to save memory, as they cannot be extended to obtain a higher probability (probabilities only decrease as the sequence is extended). The latter, desirable feature is not obtained in continuous, ie., non-circular, Stack decoders that do not ever reach a "final" probability.

The inventive Stack decoder may used to decode encoded and compressed digital speech data transmitted over a link subject to errors. Decoding may comprise decoding speech bits of lesser perceptual importance, and attempting to decode speech bits of high perceptual importance. When the Stack decoding algorithm for bits of higher perceptual importance fails to decode those bits within a given amount of time or given number of processor cycles, an erasure may be declared and passed to a speech decompressor which then uses previously correctly decoded speech data to construct an artificial fill-in waveform to mask the error event and thereby prevent unpleasant sounds, i.e., noise, interference, etc., from being heard by the listener.

Other aspects, objects and advantages of the present invention can be obtained from a study of the application, the drawings, and the appended claims.

BRIEF DESCRIPTION OF THE DRAWINGS

FIG. 7 illustrates a transmission format for transmitting a block of data bits to be decoded by the inventive Stack decoder; and FIG. 8 illustrates the overlapping of relatively delayed echoes of a transmitted signal caused by reflections from objects at different distances from the transmitter or receiver causing InterSymbol Interference.

DETAILED DESCRIPTION OF THE PREFERRED EMBODIMENT

Figure 1:
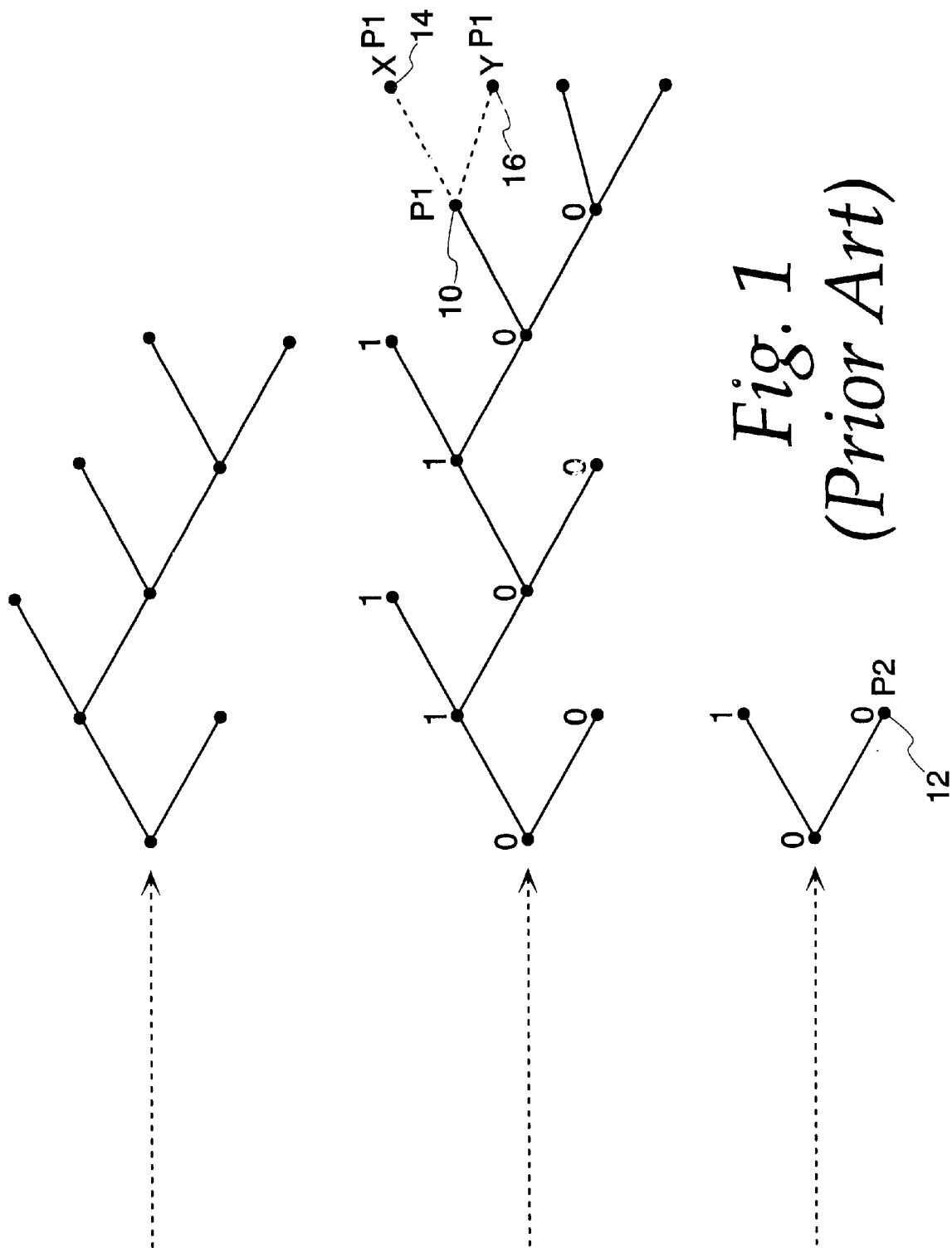
FIG. 1 illustrates a prior art Stack decoding method for decoding continuously convolutionally coded signals.
Figure 2:
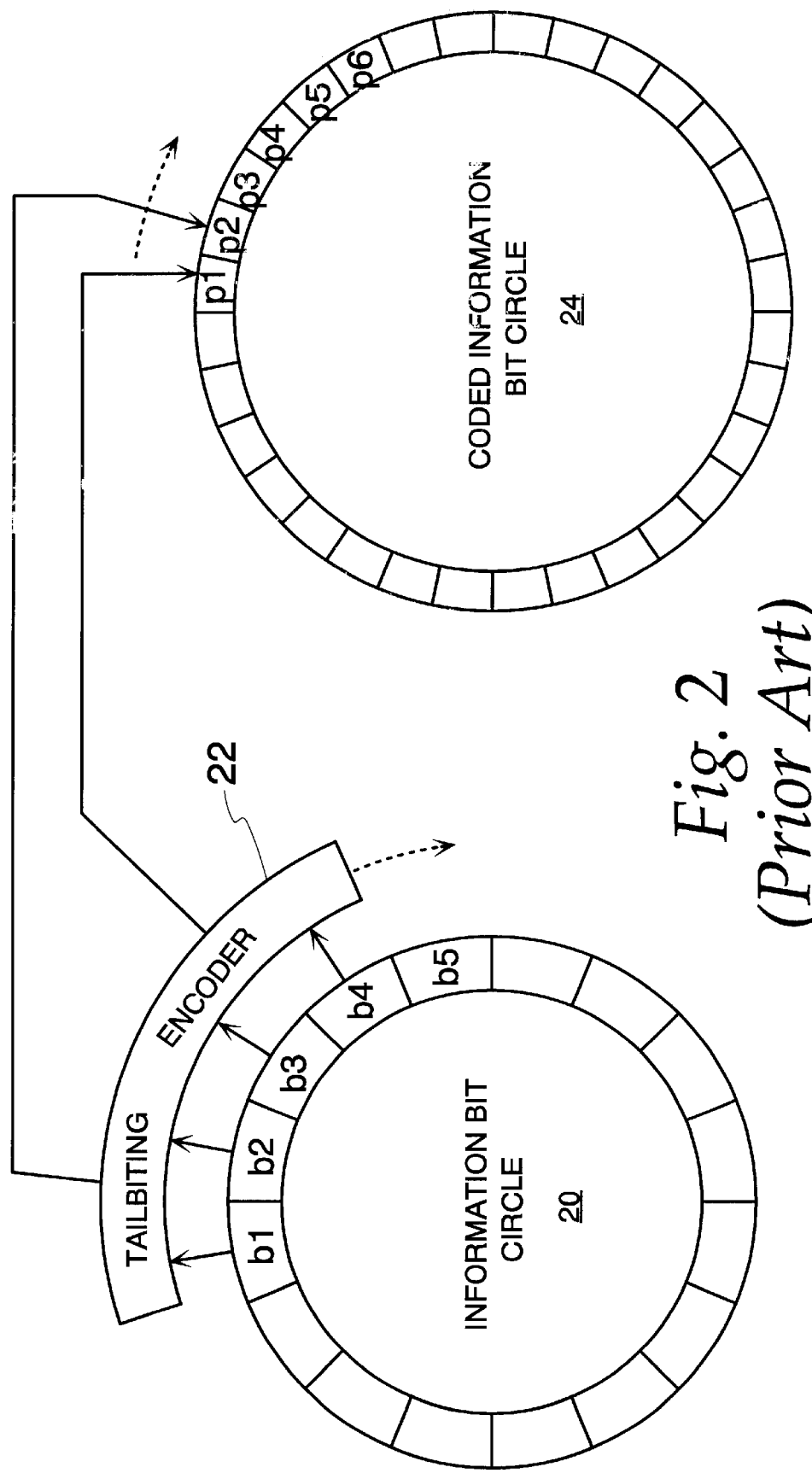
FIG. 2 illustrates a prior art technique of tailbiting encoding an information bit circuit into a coded information bit circle.

FIG. 2 illustrates a prior art technique of tailbiting encoding. In tailbiting encoding, the information bits to be encoded are generally considered as an information bit circle 20 (b1,b2,b3,b4,b5, ... ). A tailbiting encoder 22 receives the information bit circle 20 and generates a corresponding coded information bit circle 24 of encoded bits (p1,p2,p3, p4,p5, ... ).

The tailbiting encoder 22 operates on a finite number of bits at a time, called "the constraint length", which in the example of FIG. 2 is equal to four. Thus, four bits at a time, for example b1,b2,b3,b4 as shown, are received by the encoder 22, which generates a number (exemplary 2) of encoded bits, or parity bits, p1,p2. The number of parity bits generated from each group of four information bits determines "the rate" of the encoding. The rate is usually denoted by "r" which has a numerical value equal to the reciprocal of the number of parity bits produced per information bit. In the example shown in FIG. 2, the encoding rate is equal to r=½. The encoder 22 moves around the information bit circle 20 one bit at a time to produce two parity bits from each group of four information bits, the parity bits completing the coded information bit circle 24 of coded bits corresponding to the circle 20 of uncoded information bits. It will be appreciated that the encoder 22 can process groups of four information bits in any order, and does not have to move around the circle 20 smoothly or in any particular direction, clockwise or counterclockwise, as long as every possible selection of four information bits is used once and only once.

Tailbiting encoders of different rates and constraint lengths are possible, as well as punctured tailbiting encoders or coders of variable rates, such as described in U.S. patent application Ser. No. 08/943,885 now U.S. Pat. No. 6,012, 160 entitled "Protecting Important Information Bits Using Bits of Lesser Importance" of Dent filed Oct. 3, 1997, which is hereby incorporated by reference herein. The above application also describes Viterbi decoders for use with tailbiting encoders. A Viterbi decoder attempts to determine the information sequence with the highest probability of being the correct information sequence, i.e., the sequence that was actually transmitted.

In non-tailbiting applications, a Viterbi or convolutional encoder is initialized to a starting state using known symbols. The corresponding decoder is likewise initialized to a single starting state, which therefore has an associated probability of 100%. The first data bit is shifted into the encoder to generate the first of the encoded output parity bits which are transmitted to the decoder (receiver). The decoder hypothesizes that the first information bit was either a "1" or a "0", and generates two new "states" from the single starting state. The new states also include associated probability indicators, commonly called "metrics", obtained by comparing the received signal with the expected decoder output. With each successive new data bit presented to the decoder, the number of states of the decoder doubles but need never exceed $M^{(L-1)}$ where M is the number of possible symbol values in the symbol alphabet and L is the constraint length of the corresponding encoder. The number of states for binary decoding (M=2) does not therefore need to exceed $2^{(L-1)}$ as the total number of bits, including one new bit hypothesis, needed to predict the received parity bits is equal to L. Bits older than those currently needed by the decoder to predict the next parity bits do not contribute to the number of states required, but rather pass into a "path history" associated with each state. If continuous convolutional coding is employed, long after the initial start-up, the oldest bits of all of the path histories will tend to agree, and when there is unanimous agreement on any bit, it may be removed as a "final" decision thereby shortening the path histories by one bit. If there is a need to shorten path histories before all states agree in any bit position, bits may be removed as final decisions from the state having the highest probability, and the corresponding bits in other states are deleted. These issues are discussed more fully in Dent U.S. Pat. No. 5,577,053, entitled "Method and Apparatus for Decoder Optimization" which is hereby incorporated by reference herein.

For convolutional encoding of finite blocks of data, however, a method of terminating decoding is required. The path history associated with the state of highest probability may be selected, but the last L−1 bits are still associated with the $2^{(L-1)}$) states, and thus selecting the state of highest probability will give a poor reliability for these bits. This is particularly true for the most recently hypothesized bit, which has only had a single chance to affect the metrics. To provide reliable decisions for the final bits, one prior art method is to flush out the final data bits by applying L−1 known "tail bits" to the encoder. When corresponding tail bits are applied to the decoder, as these bits are known and have a single possibility rather than two possibilities, the number of remaining states is cut in half (assuming binary bits) after each tail bit has been processed until only a single state remains. The path history of that single remaining state contains the best decoding of the received signal.

The combination of the need to initialize and to terminate the encoder and decoder in known states by the use of known starting and tailing bits leads to a greater number of bits being transmitted than the number of information bits multiplied by the reciprocal of the coding rate r, and moreover leads to the first and last bits having a higher probability of being correct than those in the middle of the block. It may be more desirable to even-out the error probabilities if a method could be found to trade-off error probability between the boundary bits and the center bits of the block. Methods which delete or "puncture out" certain coded bits from the transmission can be used to do this, with the puncturing being more frequent towards the start or end of the block with the aim of obtaining a flat error probability over the block. The total number of coded bits punctured should be made equal to the number of coded bits added by using a tail, thus annulling the overhead of the tail bits. However, both the transmitter and the receiver are more complicated when puncturing patterns are used.

Alternatively, the additional transmitted bits caused by using tail bits might be traded off for more coding, i.e., a lower value of r, if the tail bits did not need to be transmitted. These issues are the reason for considering tailbiting encoders and decoders which treat every bit equally by considering blocks to be a circle of bits having no beginning or end, the beginning joining the end and thereby "biting its own tail".

The tailbiting encoder 22 in FIG. 2 is initialized by entering the first L data bits b1,b2,b3,b4, which can be any group of four data bits in the information bit circle 20. When the encoder 22 has moved around the circle 20 so that b1 once more enters the encoder, encoding continues until the first L−1 bits b1,b2,b3 have been used again. The final position with b1,b2,b3,b4 does not need to be used as it will generate the same parity bits as the first time, which have already been placed in the coded information bit circle 24 and may already have been transmitted. Thus a tailbiting encoder generates exactly N/r encoded bits from N data bits, as no extra tail bits are added. This is in contrast with the use of tail bits which generates an extra (L−1)/r encoded tail bits. A tailbiting encoder may essentially become an encoder using tail bits if L−1 known tail bits are inserted into the information bit circle 20. This creates a "special" place in the circle marking a starting point and an ending point. The corresponding decoder should then perform the "special" operations of initialization to a single starting state at the beginning, and tapering off to a single ending state, leading to an improved error rate for data bits lying close to the "special" region. To even out the error rate, one might alternatively consider distributing the L−1 known tail bits uniformly throughout the information bit circle 20. The corresponding decoder would then, upon encountering a known bit, be able to eliminate some states and cut in half the number of remaining states, thus improving the error rate for bits lying close to the known bit. There are thus various options that can be considered for optimizing decoder coder performance other than the prior art of transmitting tail bits.

If no known, or tail, bits are used, the most common form of Viterbi decoder for tailbiting codes operates as follows. The decoder is initialized using all possible patterns of L−1 starting bits b1,b2,b3,b4 to generate $2^{(L-1)}$ starting states. The number of states remains at this number $(2^{L-1})$ as decoding progresses around the circle. Decoding does not terminate when one complete revolution has been made, however, but is allowed to continue and process previously processed signal samples again. If, for example, three complete cycles are performed and the decoded data bits are selected from a path history corresponding to the middle one of the three cycles, the theory is that the initial starting uncertainty present upon beginning the first cycle and the termination uncertainty remaining at the end of the third cycle are far enough removed so as not to affect the error rate of bits decoded in the middle cycle. This theory seems to be reasonably true when the number of bits in a cyclic block is many times greater than the constraint length of the encoder, i.e., 20. The theory becomes increasingly inaccurate as the cyclic block size is shortened to only a few times the constraint length. It can be shown that the inaccuracy for short block lengths is due to the Viterbi algorithm not having the opportunity to test substantially all of the possible paths before the beginning of the circle is encountered again. The Viterbi algorithm will, in this case, select only the best path tested, which does not always include the optimum decoding of the received signal. There is therefore a need for an improved decoding algorithm for tailbiting codes of block lengths that are not a large multiple factor of the code constraint length. Moreover, the coding polynomials for short tailbiting blocks can advantageously be different from prior art optimum convolutional codes of the same rate and constraint length. Optimum coding polynomials for tailbiting codes that give the maximum hamming distance between coded blocks and the minimum number of nearest neighbors are generally different for tailbiting than for continuous convolutional coding. The use of the optimum tailbiting polynomials may also increase the tendency of the prior art Viterbi decoder algorithm to fail to discover the optimum path.

In U.S. application Ser. No. 09/041,115 now U.S. Pat. No. 6,275,538 of Rajaram Ramesh filed Mar. 11, 1998, it is shown that the optimum Viterbi decoder for use with tailbiting coded signals comprises $2^{(L-1)}$ Viterbi algorithms of $2^{(L-1)}$ states. Each algorithm is an algorithm using tail bits, with the tail bits being assumed to be a different one of the $2^{(L-1)}$ possibilities for each algorithm. In this manner, the best sequence is found that starts and ends in the same tail bits, and the best choice of the tail bits is identified by the algorithm that produces the best metric. The complexity of the optimum Viterbi algorithm for tailbiting codes is, however, the square of a normal Viterbi algorithm for codes using tail bits. There is therefore an unacceptable increase in complexity in using the optimum Viterbi decoder for tailbiting codes.

Figure 3:
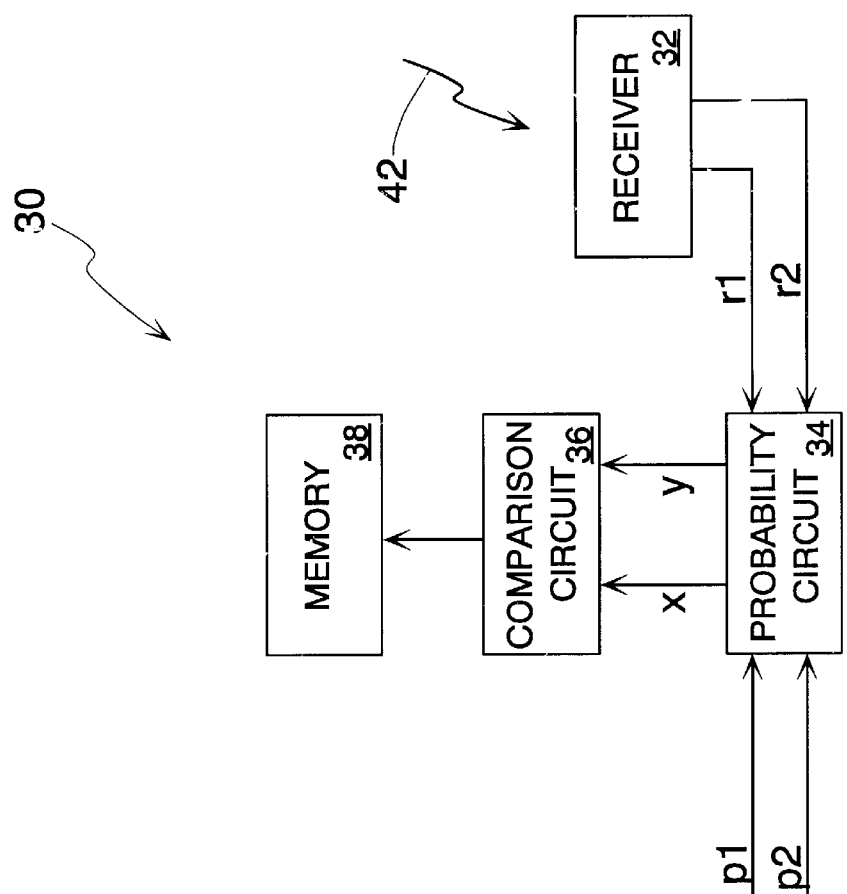
FIG. 3 is a block diagram of a tailbiting Stack decoder according to the present invention.
Figure 3:
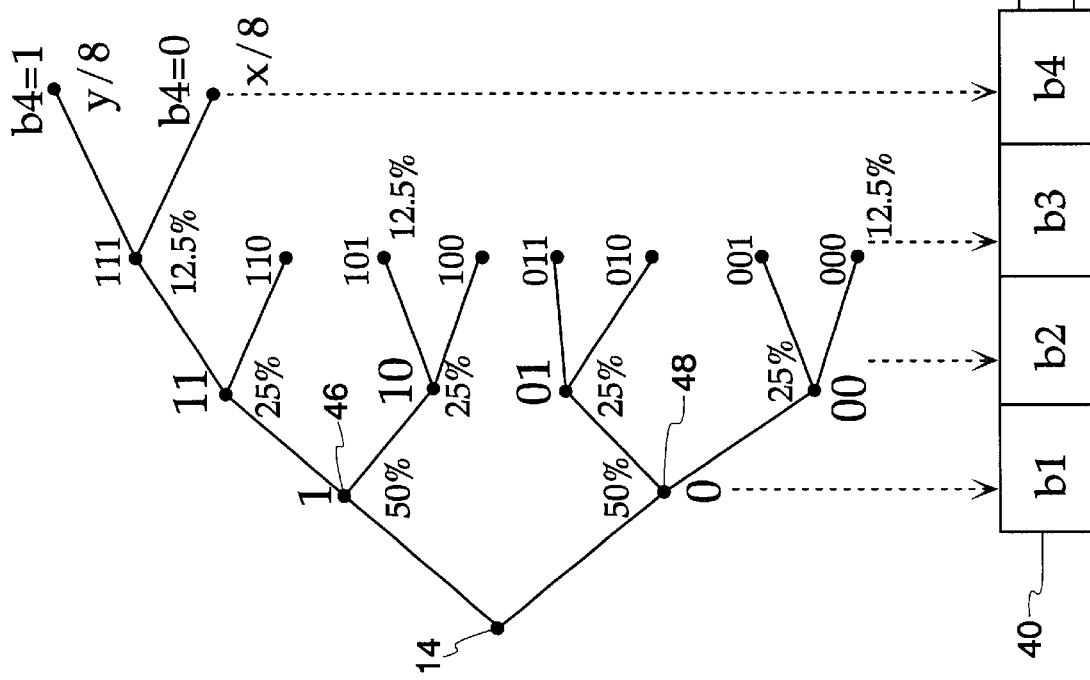

FIG. 3 illustrates a first implementation of the inventive tailbiting Stack decoder, shown generally at 30. The decoder 30 includes a receiver 32, a probability circuit 34, a comparison circuit 36, a memory 38 and an encoder 40. The receiver 32 receives a signal, represented by a line 42 comprising transmitted encoded data bits and develops received samples r1,r2.

The encoder 40 receives symbol sequences represented by paths moving from left to right. At the outset, from a single starting node 44 on the left, any decoding outcome is possible and one correct decoding must exist. Thus, the starting probability P equals 100%. Extending the first node 44 by one hypothesized symbol to two nodes 46,48 does not yet provide enough input to the encoder 40 to predict a coded bit, so the probabilities after the first extension at nodes 46,48 are just 50% each. The probabilities successively half with each further fork until eight nodes of path probability ⅛th (12.5%) are reached. Upon a further extension, four hypothesized symbols are available able to feed the encoder 40 and predict two coded bits p1 and p2. The probability circuit 34 receives the predicted bits p1,p2 and the corresponding received samples r1,r2, and develops a probability updating value x for the case b4=1 and a value y for the case b4=0. The probability values x and y for each possible path are calculated by the probability circuit 34 and fed to the comparison circuit 36 which analyzes the values and determines which path of symbols has the highest likelihood of corresponding to the received samples r1 and r2, i.e., the originally transmitted symbols. The probability values and the path histories of the various paths attempted are stored in the memory 38, and the path having the highest likelihood, as determined by the comparison circuit 36 is extended one symbol. Calculating values for x and y is preferably accomplished as follows.

There are four possibilities, 00, 01, 10 and 11, for the two coded parity bits p1,p2. The expected values of the received samples r1,r2 are any of the four possibilities These possibilities can be considered as being (a1,a2), (a1,−a2), (−a1, a2) and (−a1,−a2), where a1 and a2 are the expected signal strengths, or magnitudes, of received signal samples r1 and r2.

The values for a1 and a2 may be different due to the use of interleaving, namely, placing the transmitted parity bits p1 and p2 wide apart in time so that they experience different signal fading and thereby improving the tolerance of the coded communications system to fading by dispersing errors in time. The relative probabilities of the four possibilities are given by:

$$e^{-\left[\frac{(r1-a1)^2}{2\sigma_1^2} + \frac{(r2-a2)^2}{2\sigma_2^2}\right]} = P(00)$$

$$e^{-\left[\frac{(r1-a1)^2}{2\sigma_1^2} + \frac{(r2+a2)^2}{2\sigma_2^2}\right]} = P(01)$$

$$e^{-\left[\frac{(r1+a1)^2}{2\sigma_1^2} + \frac{(r2-a2)^2}{2\sigma_2^2}\right]} = P(10)$$

$$e^{-\left[\frac{(r1+a1)^2}{2\sigma_1^2} + \frac{(r2+a2)^2}{2\sigma_2^2}\right]} = P(11),$$

where σ1 and σ2 are the rms values of the noise on samples r1 and r2 respectively.

The rms noise values $\sigma_1$, and $\sigma_2$ on the two received signal samples r1 and r2 will generally not be equal either, again due to the effect of interleaving. The above expressions can be rewritten in more useful form by realizing that it is only necessary to preserve the correct probability ratios, rather than absolute probability values. A common scaling may be applied to the absolute probability values, preferably one which leaves the highest of the four probabilities still less than or equal to unity. This ensures that cumulative probability metrics can only successively decrease. Scaling results in the following probability metrics:

$$e^{-\left|[z_1 \frac{(s1-1)}{2}]^2 + [z_2 \frac{(s2-1)}{2}]^2\right|} = P(00)$$

$$e^{-\left|[z_1 \frac{(s1-1)}{2}]^2 + [z_2 \frac{(s2+1)}{2}]^2\right|} = P(01)$$

$$e^{-\left|[z_1 \frac{(s1+1)}{2}]^2 + [z_2 \frac{(s2-1)}{2}]^2\right|} = P(10)$$

$$e^{-\left|[z_1 \frac{(s1+1)}{2}]^2 + [z_2 \frac{(s2+1)}{2}]^2\right|} = P(11),$$

where $z_1$, and $z_2$ are the signal-to-noise ratios for samples r1 and r2 and s1,s2 are normalized values of r1,r2 with magnitude 1.

While the above metrics have different values than the originals, they bear the same ratio to each other providing that $$z_1^2 = a_1 \cdot r_1 / 2\sigma_1^2$$

and $$z_2^2 = a_2 \cdot r_2 / 2\sigma_2^2$$

The normalized values s1 and s2 may be taken as the signs of the received samples r1 and r2, with z1 and z2 equal to the magnitudes of r1 and r2 divided by the rms noise level on the corresponding sample. The receiver 32 may include a de-modulator (not shown) arranged directly to output values s1·z1² and s2·z2² instead of just Boolean 1's and 0's (corresponding to s1,s2=±1), which values are commonly known as "soft values". Receiver demodulators that output soft values are, for example, described in Hammar U.S. Pat. No. 5,099,499, which is hereby incorporated by reference herein.

Since s1 and s2 are ±1, in the above metrics either the term in z1 vanishes if the received sign s1 matches the predicted parity bit p1, or the term in z2 vanishes if s2 matches p2. If both match, the relative probability value will be unity.

It should be noted that the above probabilities are relative probabilities. To obtain absolute probabilities, the sum of the four probabilities may be forced to be unity by dividing each by P(00)+P(01)+P(10)+P(11). However, the scaling that naturally results from the above formulae, in which the relative probability value is unity for the case where s1=p1 and s2=p2, is useful in the inventive Stack decoder. The path will not be penalized and thus will not become of lower probability than the second best path as long as all predicted polarities match the received signal polarities. The case where the sign of the received samples match the sign of the predicted samples is referred to herein as "zero syndrome". Such a path (a zero syndrome path) will thus be extended indefinitely so long as no polarity errors occur, i.e., so long as the hard-decoding syndrome remains zero.

It may be more convenient to operate with cumulative addition of negative log-likelihoods than multiplicative accumulation of probabilities. When the negative logarithms of the above probabilities are taken a simple rule remains:

Add $z1^2$ to the metric if s1 and p1 are not the same polarity.

Add $z2^2$ to the metric if s2 and p2 are not the same polarity

Since the metric of the best path (that with the lowest cumulative metric) will still be the best metric so long as s1=p1 and s2=p2, zero syndrome paths will be rapidly extended without backtracking. When a polarity error (a non-zero syndrome) is encountered, the best metric is increased appropriately and the second best path may now have the lowest metric, i.e., becomes the best metric and will thus be extended. By using a metric that can only grow, a path which is successfully extended around the whole circle of information bits, while still at the end having the lowest metric, is assured of being the globally best path. No abandoned partial path, which already has a higher metric than the complete circular path metric, can ever reduce its metric and become the best metric, since at every path extension the metric is either increased or left the same.

A simplified explanation of the metrics is now provided. If $r_i$ is received signal values, and $S_i$ is the parity bit values (equal to +1 or −1) that are predicted from a given hypothesis of the underlying information bits, and $a_i$ is the signal amplitude at the time parity bit (i) was transmitted, then the cumulative path metric is given by:

$$\sum_i \frac{(r_1 - a_i S_i)^2}{2\sigma_1^2} = \sum_i \frac{r_i^2}{2\sigma_i^2} - \sum_i \frac{r_i a_i S_i}{\sigma_1^2} + \sum_i \frac{a_i^2 S_i^2}{2\sigma_i^2}$$

where ($\sigma_i$ is the standard deviation of the noise on received sample (i).

The first and last terms in the above metric are independent of the choice of symbol sequence $S_i$ so long as the symbols $S_i$ are of the same amplitude, e.g., +/−1 for binary. Therefore only the center term of the above metric is useful in discriminating the most likely sequence from the other lesser likely sequences. To minimize the overall metric, the negative center term should be made to be as large as possible.

The receiver 32 may be arranged to output directly the values $$\zeta_i = \frac{a_i r_i}{\sigma_i^2}$$

which are called "soft information". Then the metric desired to be minimized by the choice of symbols $S_i$ is $$\sum_i -\zeta_i S_i$$

$$\rho_{i-} \zeta_i S_i$$

This metric may increase or decrease every time the symbol $S_i$ is extended to $S_{i+1}$. In order to produce a metric which can only increase when the symbol is extended, a value is added to the metric that does not depend on the choice of symbol sequence. The sum of the moduli of the soft information values is added, thus obtaining a new metric:

$$\sum_i |\zeta_i| + \sum_i -\zeta_i S_i = \sum_i |\zeta_i| - \zeta_i S_i = \sum_i |\zeta_i|(1 - s_i S_i)$$

where $s_i$ is the sign or phase of the soft information and $S_i$ is the sign or phase of the hypothesized bit or symbol. In the case of binary information where the factor $(1-s_i S_i)$ is zero if the signs of $s_i$ and $S_i$ agree, and 2 if they disagree, the algorithm amounts simply to adding the magnitude of the soft information if there is a sign disagreement (a syndrome) or adding nothing if the signs agree (zero syndrome). Use of an only increasing metric ensures that a path that is selected to be extended because it has the minimum metric will continue to be the path with the minimum metric so long as no sign errors (syndromes) occur. Since zero syndromes are encountered for a high pro-portion of the time during decoding, paths are extended rapidly through the zero syndrome regions of the signal. Since the metric can only increase, if a path reaches the end while still having the lowest metric, no other path which already has a higher metric can possibly become lower by extending the path to the end. Only if another, incomplete path has exactly the same metric as a complete path may it be necessary to extend the incomplete path until either its metric exceeds the metric of the complete path, or until it reaches the end, also with an identical metric value. If there are two or more finally extended paths with the same identical metric value, either is equally likely to be the correct decoding of the received signal. Other information, such as a cyclic redundancy check (CRC) may be used to determine which one is correct. If CRC codes are used to provide error detection, one strategy can be to program the inventive Stack decoder to obtain any result which reaches the endpoint first, and perform the CRC check. If the CRC check indicates no errors the result is accepted. If the CRC check indicates errors, the result is rejected and the next best path is extended until a second best final metric is obtained. The CRC is performed on the second best final metric and the process continues until a result is accepted.

It is disclosed in Dent U.S. Pat. No. 5,577,053, incorporated by reference herein, that a decoder, such as a Generalized Viterbi Algorithm, can be used to produce a best decoded result, a second best decoded result and so on, in order of probability, and a CRC check used to find the result with the highest probability that passes the CRC check. The inventive Stack decoder/algorithm disclosed herein is more advantageous than the Generalized Viterbi Algorithm, as the latter (GVA) computes all the candidate results at the same time, while the Stack decoder/algorithm only need compute an additional candidate result if the previously computed result failed the CRC check.

When a path is extended to two new nodes, one of the new nodes may reuse the storage space in the memory 38 originally assigned to store the old node's probability metric and path history. If the traceback method is used to determine path history, however, at least a single bit of the path history and a pointer to a previous node must be retained at each node. If only the path history (i.e., the hypothesized symbol sequence that led to the node) is stored at the node, then old nodes that have been extended may be overwritten, thus making it difficult, if not impossible, to use the traceback method.

In the present invention of the tailbiting Stack decoder 30, when the last bit of a circular information symbol block has been hypothesized, there remain (L−1)/r as yet unused received signal samples, corresponding to the parity bits output from the transmitting encoder when the first L−1 information bits are fed into the transmitting encoder again to complete the circle of encoding. Since all information symbols are available on the path, the last (L−1)/r parity bits may be predicted, where "r" is the rate of the code, i.e., r=½ for one-half rate encoding, and combined with the corresponding received samples to produce a final metric in a final, burstwise-extension to complete the circle.

Thus, the inventive tailbiting Stack decoder/algorithm, when reaching the end of a cyclic block of symbols, performs a final burst-extension of L symbols all at once. The final burst-extension includes hypothesizing one final symbol and using the first hypothesized L−1 symbols again, leading to a pair of terminal metrics for a pair of paths differing in symbol N. If one of these metrics is still the smallest metric, no other path, which already has a greater metric, and therefore a lower probability, can ever attain a lower metric, and therefore a higher probability, by further extension. Thus the optimum decoded result has been identified which is the best, or Maximum Likelihood Decoding, of the received signal.

If, on the other hand, one of the terminal probabilities is not the lowest, other paths will now be extended until either they complete a full cycle to produce a better terminal probability, or until they exceed the best terminal probability. When no path has an associated probability that is lower than the best terminal probability, then decoding has terminated and the Maximum Likelihood Decoding is given by the symbols along the path leading to the best terminal probability (lowest terminal metric).

Figure 4:
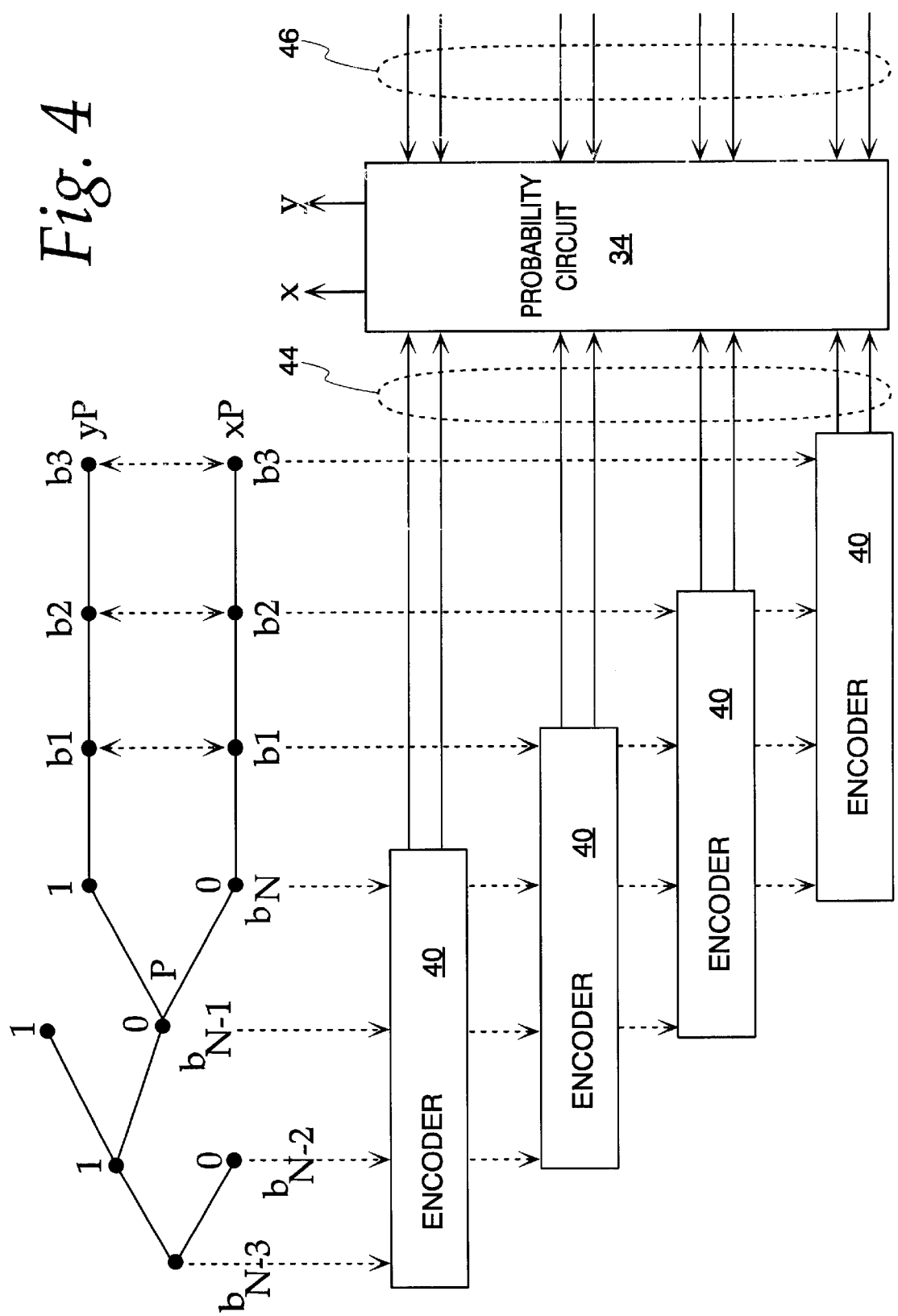
FIG. 4 is a block diagram illustrating the Stack decoder of FIG. 3 performing a final burst-extension to obtain a pair of terminal probabilities.

The process of performing a final burst-extension of L symbols to obtain a pair of terminal probabilities is shown in FIG. 4. A path which has already been extended to encompass hypotheses for bits bN−3, bN−2 and bN−1 is extended by hypothesizing bit bN. Since the extension will complete a circle of N bits, the encoder 40 will now have all the information needed to produce parity bit predictions for the cases bN−3, bN−2, bN−1, bN
bN−2, bN−1, bN, b1
bN−1, bN, b1, b2
bN, b1, b2, b3 using the same values for b1, b2 and b3 as previously determined when the path began.

The above-identified cases are received by the encoder 40 in a burst to hypothesize the final eight parity bits 44, which are combined with the final eight received signal samples 46 in the probability circuit 34 to produce terminal branch probabilities x and y for the cases bN=1 and bN=0 respectively. These are combined, by the comparison circuit 36 (see FIG. 3) with the penultimate probability P at node bN−1 to produce terminal probabilities xP and yP, or alternatively, if negative log-likelihood accumulation is used, the probability circuit 34 calculates metrics x and y by adding soft values corresponding to non-zero syndromes detected between the final eight parity and received samples, and then the metrics x and y are added by the comparison circuit 36, to the penultimate negative log-likelihood P to obtain the two terminal metrics xP and yP.

If one of the two terminal metrics is determined by the comparison circuit 36 to have the highest of all probabilities (lowest metric), the symbols on the path leading to that probability are selected (for example by the traceback procedure) to be the Maximum Likelihood Decoding of the received signal. Otherwise, other paths are extended from other nodes until they fall below the best terminal probability (accumulate a higher metric) or until they produce a better terminal probability. All stored paths that have a lower probability than any terminal probability may be expunged to save and reutilize space in the memory 38.

Figure 5:
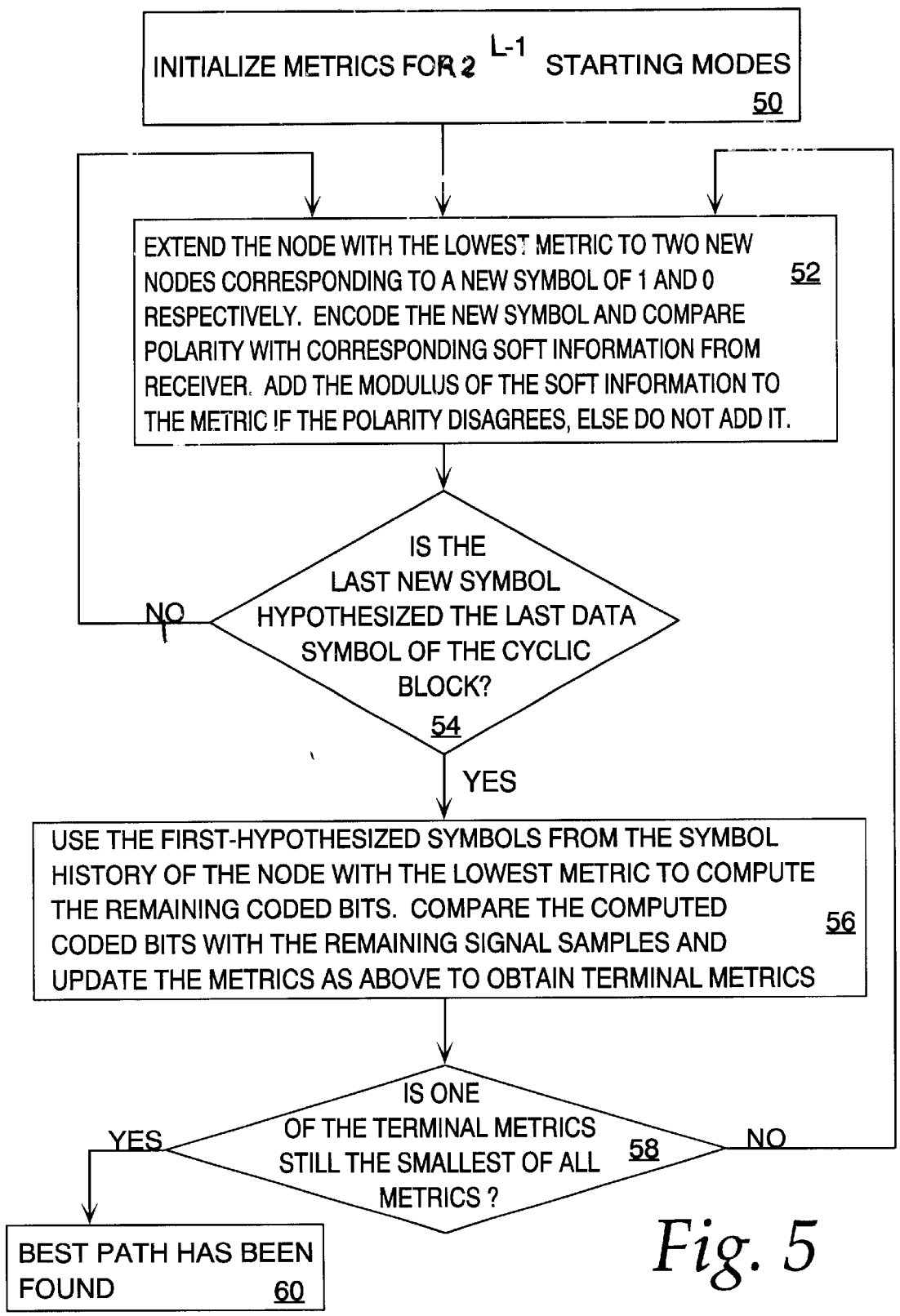
FIG. 5 is a flow chart illustrating a method of tailbiting decoding according to the present invention.

A flow chart illustrating the above-described method is shown in FIG. 5. The method begins at step 50 where metrics for $2^{L-1}$ starting nodes are initialized. This may consist of initializing a number of nodes corresponding to all possibilities of the first L−1 bits to have, for example, zero log-likelihood metrics. Upon proceeding to step 52 for the first time, the Lth bit is hypothesized to be either a 1 or a 0, generating two branches to two new nodes. With L bits in the path history of these two new nodes, the encoder 40 can be operated for the first time to predict 1/r coded bits. The predicted coded bits are compared in polarity with soft information from the receiver demodulator and the metrics for the two new nodes are produced by adding the modulus of the soft information to the metric of the parent node only when the polarity disagrees. If, for one of the nodes, no polarity disagreements occur, i.e., the path is a zero syndrome path, that node will still have a zero metric and is selected to be extended further, in preference to one of the other starting states. Otherwise, one of the other starting states with an as-yet zero metric will be selected to be extended. It is possible that after the first execution of step 52 that the number of nodes will have increased to 2L by extending all starting states by one symbol. The method proceeds to step 54 where it is determined if all data symbols have been hypothesized along the just-extended path. If it is determined that the last new symbol is not the last symbol of the cyclic block at step 54, the method proceeds back to step 52, where the node with the lowest metric is extended one symbol, parity bits are generated, and metrics are calculated and compared to determine the path with the lowest metric (highest probability). If it is determined that the last new symbol is the last symbol of the cyclic block at step 54, then the method proceeds to step 56. At step 56, since all data symbols are now available along the just-extended path, all remaining coded bits in the circle of coded bits can be computed from the first-hypothesized symbols in the path history, and compared with corresponding soft information samples to produce terminal metrics for the two branches generated at the last node extension. The two terminal metrics are compared with the other metrics to determine if either of them is the lowest metric of all at step 58. If one of the terminal metrics is still the smallest at step 58, then no other metric can ever become lower, as upon extending a path a quantity is never subtracted from a metric. This being the case, the method terminates at step 60 indicating that the path history associated with that particular terminal metric is the best decoded result. If it is determined at step 58 that a metric other than one of the terminal metrics is lower, then the method returns to step 52 to extend the node with the lowest metric until either all metrics become higher than the lowest terminal metric, or another terminal metric is produced that is determined at step 58 to be the lowest of all. Thus, when at least one terminal metric has been produced, the flow chart of FIG. 5 should include an additional test, after step 52, to compare the metrics after a path extension to the lowest terminal metric, and to delete paths having a higher metric than the lowest terminal metric. These steps were omitted from FIG. 5 for simplicity, but are shown in FIG. 6 for completeness.

Figure 6:
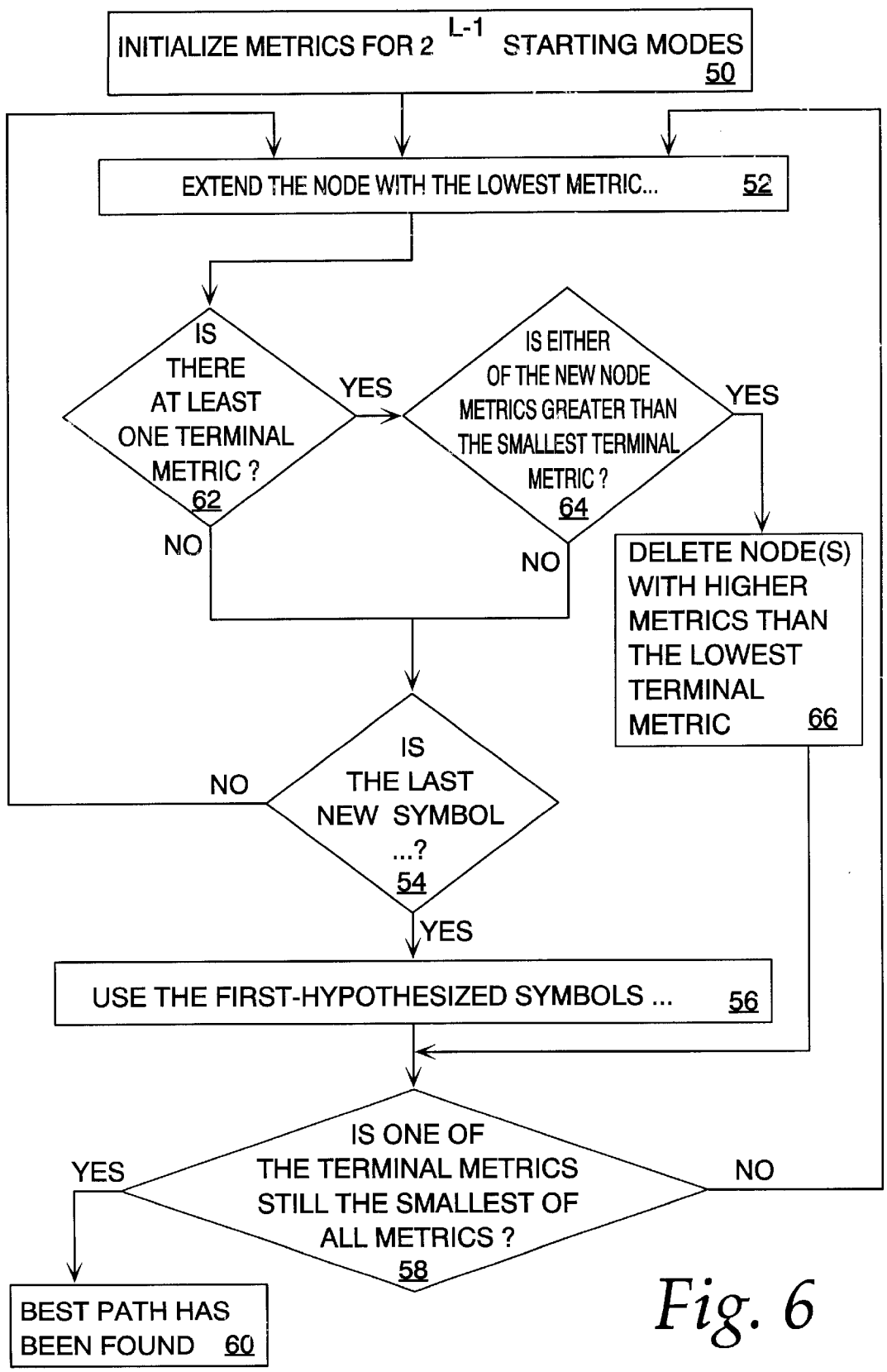
FIG. 6 is a flow chart illustrating an alternate method of tailbiting decoding according to the present invention.

The flow chart of FIG. 6, begins with steps 50 and 52, similar to FIG. 5. After step 52, the method proceeds to step 62 where it is determined if there are any terminal metrics as yet. If not, then the method proceeds to step 54 and continues as previously described with respect to FIG. 5. If it is determined at step 62 that there is at least one terminal metric, then the smallest terminal metric is compared with the two new branch metrics just produced at step 64. If any branch metric is higher than the lowest terminal metric at step 64, then that branch (path and associated metric) is deleted at step 66 and the method proceeds to step 58 and continues as previously described with respect to FIG. 5. If it is determined at step 64 that neither of the two new node metrics are greater than that the smallest terminal metric, then the method proceeds to step 54 and continues as previously described with respect to FIG. 5.

It is possible that the receiver demodulator may output logarithmically encoded soft values in order to be able to represent received parity bits of widely different signal-to-noise ratios without requiring large wordlengths. Log-encoded soft values may either be converted to non-log-encoded values prior to metric accumulation, or alternatively logarithmic metric accumulation may be used by employing a process to produce the logarithm of the sums of a number of logarithmically encoded values, for example, by the process described in Dent U.S. Pat. No. 5,944,774 which is hereby incorporated by reference herein. The use of logarithmically encoded values also lends itself to any post-demodulator scaling or "digital AGC (Automatic Gain Control)" that may be needed to obtain soft values appropriate for use by the Stack decoder. Scaling logarithmic values is generally achieved by adding or subtracting a constant from them, as described in Dent U.S. Pat. Nos. 5,646,963, 5,615,231 and 5,568,518, all entitled "Fast Automatic Gain Control", and which are all hereby incorporated by reference herein. However, other scaling may be implemented as will be apparent to those skilled in the art.

A typical application of the inventive decoder is in decoding encoded, compressed digital speech that has been received over a medium subject to errors, such as a cellular radio link. Speech is first digitized using linear PCM (Pulse-Code Modulation) at an exemplar sampling rate of 8 kilosamples/sec, or sometimes 16 kilosamples/sec. The linear PCM speech representation is then subject to a compression algorithm, such as various prior art algorithms known as ADPCM (Adaptive Differential PCM), RELP (Residually Excited Linear Prediction), CELP (Code Excited Linear Prediction), VSELP (Vector Sum Excited Linear Prediction) and AMBE (Advanced Multiband Excitation) that are used in various digital wireless telephone systems, and which have been ordered above according to the amount of compression achieved. AMBE achieves the maximum compression while preserving good speech quality at an output bit rate of 3.6 kilobits/sec.

Whenever speech is compressed by exploiting its high degree of redundancy and reducing the redundancy, the remaining bits carry more information than the original bits and cause greater disruption to speech quality if decoded in error. Depending on the type of compression used, the output bits may not be of equal perceptual significance in regard to the effect errors may have on speech quality. For example, in a known AMBE compressor yielding seventy two output bits per 20 ms, twelve of the bits are of very high perceptual importance and merit a higher degree of coding protection than the remaining sixty. Thus, bits may be divided into highly important, or class-I bits, and less important, or class-II bits. The class-I and class-II bits are coded using different amounts of error correction coding as described in the above-incorporated (Ser. No. 08/943,885) patent application. For example, the twelve most important bits may be encoded using a rate 1/5 code to obtain sixty coded bits, and the remaining sixty bits encoded using a rate 1/3 code to obtain 180 coded bits, totally 240 coded bits altogether The 240 coded bits may then be divided into two sets of 120 bits by means of a puncturing pattern, such as, in the simplest case, dividing the bits into groups of odd and even numbered bits respectively. The bits of one group represent the speech block coded using a first rate 2/5 and rate 2/3 code, and the second group represents the speech block coded using a second rate 2/5 and rate 2/3 code complementary to the first code, such that the two groups combined form an optimum rate 1/5 and rate 1/3 code. Either block may be transmitted alone using a first channel, such as a first time slot in a TDMA (Time Division Multiple Access) frame period, and the second block may or may not be transmitted using a second channel, depending on availability of the second channel. The two blocks may also be relayed via different orbiting satellites or cellular base stations to provide spatial diversity.

The coding of the most important twelve bits by a tailbiting coder is appropriate due to the alternative of using tail bits representing a very significant overhead that could better be used to increase the amount of coding, i.e., to reduce the rate "r" of the code. Such coding also has the feature that the length of the sequence coded, twelve bits, is not very much larger than the typical code constraint length. Special code searches tailored to this type of problem suggest optimum code polynomials that are different than the code polynomials that are optimum for continuous convolutional coding. These optimum polynomials were found, however, during simulation of decoding using a Viterbi algorithm (with wraparound for tailbiting) also to be the most susceptible to lead the Viterbi algorithm astray and thereby miss the maximum likelihood result. The current invention avoids this deficiency of the tailbiting Viterbi algorithm.

A constraint length eight, rate 1/5 punctured rate 2/5 tailbiting code applied to twelve data bits may be decoded by first initializing the inventive Stack decoder to 256 nodes, corresponding to all possibilities of the eight bits in the starting encoder state, and computing initial path metrics using the first five soft-demodulated received signal samples. Alternatively, for a punctured rate 2/5 code, the starting decoder state produces either two or three signal values while the following state produces three or two signal values to yield five coded signal values for every two data bit shifts. Due to being able to start tailbiting decoding anywhere in the circle of information bits, it can be advantageous to pick a starting point that yields three coded signal values rather than two, thereby providing initial metrics based on three soft demodulated received signal values that will differentiate incorrect paths from the correct path efficiently.

The algorithm proceeds by extending the path having the best (lowest) metric indicative of highest probability. Only four extensions are needed to complete the circle of twelve bits, after which a terminal metric may be computed for the best path by performing final burst-extension as previously described. If this final metric is still the best metric, it is the maximum likelihood result. Alternatively, the second best path would be extended, and so forth. If no maximum likelihood result is identified after a given amount of processing, an erasure is declared. When an erasure is declared, the voice decoder takes specific action to avoid outputting unnatural, unpleasant sounds, by known methods generally known as "deburping", or known more academically as "speech interpolation" or "artificial parameter reconstruction".

The maximum likelihood result is used to recompute a scrambling mask for the other 180 coded bits corresponding to the rate 1/3 code applied to the 60 bits of lesser importance. The recomputed scrambling mask is used to unscramble the 180 bits (or 90 in the case of a punctured rate 2/3 code). These 90 or 180 bits are then decoded by either a tailbiting Viterbi algorithm or by a second application of the inventive Stack algorithm. If the latter is used and fails to identify the maximum likelihood result after a second amount of processing, an erasure is declared. If, on the other hand, a tailbiting Viterbi algorithm is used, which is more likely to perform adequately due to the larger block size, it is allowed to decode the entire circle of bits with a wraparound or overlap such that the first decoded bits are decoded at least a second time, and decoding stops when either a sufficient number of bits decoded for the second time agree with the bits decoded on the first cycle, or decoding stops after a given overlap and the center circle of decoded bits, omitting the first and last decoded bits, is selected from the state having the best metric as the decoded result. A corresponding decoder metric for the selected bits must be calculated before the first of the circle of bits is decoded from the metric and just after the last of the circle of bits is decoded. This requires saving metrics at at least those two specific points during decoding. The final metric thus computed may be used as an indication of the reliability of the unscrambling mask, and therefore of the decoding of the twelve most important bits. If this reliability is too low, an erasure may be declared. When an erasure is declared for any of the above reasons, it is preferable to cause the speech decompressor to perform artificial reconstruction of a "best guess" for the speech waveform based on historical or surrounding correctly decoded speech blocks, rather than to pass erroneous bits to the speech decompressor. Derivation of artificial fill-in waveforms is described in Dent U.S. Pat. No. 4,532,636, which is hereby incorporated by reference herein.

Thus a new, tailbiting Stack decoder has been described above for processing soft information from a radio signal demodulator to decode a circular block of information bits. The new decoder does not suffer from the deficiency of the prior art Viterbi Algorithm of "missing" the true Maximum Likelihood result, and avoids the complexity of multiple Viterbi decoders. It also avoids the unlimited amount of back-tracking that can occur with prior art, non-tailbiting Stack algorithms, while avoiding the overhead of tail bits that may alternatively be employed to delimit block sizes.

Tailbiting may appear in other contexts in which the inventive Stack decoder/algorithm may be usefully employed. For example, FIG. 7 illustrates a transmission format shown generally at 70 for transmitting a block 72 of data bits b1–bn including a cyclic repeat 74 of the last bits of each transmitted block prior to transmission of the first bits of the block. FIG. 8 illustrates, at 76, the overlapping of relatively delayed echos caused by reflections from objects at different distances from the transmitter or receiver, causing InterSymbol Interference (ISI). Thus each received signal sample depends on a group of adjacent symbols according to the set of equations:

$$r1 = C0 \cdot S1 \quad +C1 \cdot Sn \quad +C2 \cdot S(n-1) \quad +C3 \cdot S(n-2) \quad +C4 \cdot S(n-3)$$

$$r2 = C0 \cdot S2 \quad +C1 \cdot S1 \quad +C2 \cdot Sn \quad +C3 \cdot S(n-1) \quad +C4 \cdot S(n-2)$$

$$r3 = C0 \cdot S3 \quad +C1 \cdot S2 \quad +C2 \cdot S1 \quad +C3 \cdot Sn \quad +C4 \cdot S(n-1)$$

$$r4 = C0 \cdot S4 \quad +C1 \cdot S3 \quad +C2 \cdot S2 \quad +C3 \cdot S1 \quad +C4 \cdot Sn$$

-continued $$r5 = C0 \cdot S5 \quad + C1 \cdot S4 \quad + C2 \cdot S3 \quad + C3 \cdot S2 \quad + C4 \cdot S1$$

$$r6 = C0 \cdot S6 \quad + C1 \cdot S5 \quad + C2 \cdot S4 \quad + C3 \cdot S3 \quad + C4 \cdot S2$$

$$r7 = C0 \cdot S7 \quad + C1 \cdot S6 \quad + C2 \cdot S5 \quad + C3 \cdot S4 \quad + C4 \cdot S3$$

$$r8 = C0 \cdot S8 \quad + C1 \cdot S7 \quad + C2 \cdot S6 \quad + C3 \cdot S5 \quad + C4 \cdot S4$$

$$\vdots \qquad\qquad\qquad\qquad\qquad \vdots$$

$$r(n-3) = C0 \cdot S(n-3) \; + C1 \cdot S(n-4) \; + C2 \cdot S(n-5) \; + C3 \cdot S(n-6) \; + C4 \cdot S(n-7)$$

$$r(n-2) = C0 \cdot S(n-2) \; + C1 \cdot S(n-3) \; + C2 \cdot S(n-4) \; + C3 \cdot S(n-5) \; + C4 \cdot S(n-6)$$

$$r(n-1) = C0 \cdot S(n-1) \; + C1 \cdot S(n-2) \; + C2 \cdot S(n-3) \; + C3 \cdot S(n-4) \; + C4 \cdot S(n-5)$$

$$r(n) = C0 \cdot Sn \qquad + C1 \cdot S(n-1) \; + C2 \cdot S(n-2) \; + C3 \cdot S(n-3) \; + C4 \cdot S(n-4)$$

where r1 ... r(n) are received signal samples;

S1 ... Sn are transmitted symbols; and

C0 ... C4 are multipath propagation, ISI or "channel" coefficients.

The above equations are cyclic due to the inclusion of the cyclic preamble, suggesting that a cyclic or tailbiting equalizer may be appropriate to determine transmitted symbols S1 ... Sn from the received symbols r1 ... r(n) and thereby compensate for the ISI. One type of tailbiting equalizer that can be constructed according to the invention is a tailbiting Viterbi equalizer. The tailbiting Viterbi equalizer is appropriate when the number of symbols of ISI, that is the number L of symbols S1, S2 ... on which each received sample r1, r2 ... depends, results in the number of equalizer states $2^L$ being reasonable for practical implementation. Numbers of states of the order of 16–64 are regularly employed in prior art equalizers, and numbers of states up to 256 are regularly employed in convolutional error correction decoders. Therefore, a reasonable number of states is a number less than or equal to 256, but with improvements in digital signal processing technology this number could double every 18 months according to Moore's law. The number L of symbols of ISI in the above example equations is five, which requires a 16-state tailbiting equalizer. In addition, the equalizer needs to know the ISI coefficients C0 ... C4, commonly referred to as channel estimates. The most difficult case occurs when the channel estimates must be estimated at the same time as the unknown symbols S1 ... Sn using only the n received values r1 ... r(n), the problem then being known as "Blind Equalizing". One type of Blind Equalizer is disclosed in Dent U.S. Pat. Nos. 5,557,645 and 5,619,533, which are hereby incorporated by reference herein. Blind, tailbiting equalizing will not be addressed herein. Instead, it is assumed that either the channel estimates C0 ... C4 have been estimated by independent means, such as correlating with a pilot code or pilot symbols in the case of CDMA (Code Division Multiple Access) systems, or alternatively by agreeing a-priori between the transmitter and the receiver on some fixed values for some of the symbols S1 ... Sn, from which the channel coefficients C0 ... C4 can be estimated.

For example, if at least 2L−1 successive symbols such as S1 ... S9 are pre-agreed constant symbols, then five equations, e.g., those for r5 ... r9, are obtained for C0 ... C4 in which no unknown symbols are involved. Thus, a single initial starting state having a single path history composed of the L symbols S1 ... S5 and corresponding to a single initial L−1 symbol hypothesis S6 ... S9 is obtained along with an as yet zero path metric and an initial set of channel estimates C0 ... C4. Following initialization of the above single starting state, the next unknown symbol, S10 is hypothesized, first to be a Boolean "0". Channel estimates C0 ... C4 and symbols S6 ... S10 are then used in the equation for r10 to predict the value of the signal sample r10 which should be received. The predicted value is subtracted from the actual received value of sample r10 and the square of the difference is added to the initially zero path metric to obtain a new metric which is the metric of a new state corresponding to the L−1 symbols S7 ... S10, with S10 zero. S6 passes into the path history for that state, which will contain now S1 ... S6. The procedure is repeated for S10 equal to Boolean "1" to obtain a second state corresponding to S7 ... S10, with S10 one. These two states are in turn bifurcated by hypothesizing S11 and so forth until 2L−1=16 states have been created corresponding to all possibilities of S10 ... S13. Thereafter, when S14 is hypothesized, it is hypothesized first using a state with S1="0", and then with S10="1". All other symbols being the same, that giving the best path metric is selected to be new state S11 ... S14, with the value S10 from the state giving the best metric passing into the path history of that state. This procedure continues in conformity with the prior art Viterbi equalizer until the "tail" is encountered, at which point the inventive procedure for terminating a tailbiting decoder is employed.

The "tail" is encountered when the last bit Sn has just been hypothesized and the received value r(n) has been processed to update the path metrics. It remains to process received samples r1 ... r4 which were not used to form initial channel estimates because at that time the equations for r1 ... r4 involved the as yet unknown symbols Sn, S(n−1), S(n−2) and S(n−3). These unknown symbols however correspond at this point to the 16 states, with each state containing a different hypothesis for those symbol values. Since the remaining four equations for r1 ... r4 depend only on known symbols S1 ... S4 and the symbols associated with the states, the received samples r1 ... r4 may be estimated for each state, using that state's values for S(n) ... S(n−3) and S1 ... S4 and the four estimated values of r1 ... r4, subtracted from corresponding received values of r1 ... r4 to provide a final updating of the metric of each state based on the four remaining received samples r1 ... r4. The state having the lowest final updated metric then contains the best decoded result. Alternatively, the metrics may be updated by processing one received value at a time, starting with r1 and using the known value of S1 to obtain a number of states contracted by two to $2^{L-2}$, then r2 using S2 to obtain $2^{L-3}$ states, and so forth until a single final state remains containing the Maximum Likelihood Decoded result.

When the number of symbols of ISI would lead to an excessive number of states for a Viterbi equalizer, it is known to reduce the number of states by allowing some of the symbols in a row of the above equations to have already passed into path history, which is known generally as "per-survivor" processor or using DFE (Direct Feedback Equalizer) taps as known in the art. It is also known that DFE taps should preferably be associated with lower values of the channel coefficients Ci and "Viterbi taps", or those L−1 symbols hypothesized to all different possible combinations of values in association with the number $2^{L-1}$ of states, should be associated with higher values of the Ci. If the first values, e.g., C0 . . . C3, are higher than values C4 . . . C(L−1), this is achieved by processing received samples in time-order of reception, i.e., moving clockwise around the tailbiting circle. Otherwise, if C(L−1) . . . C(L−4) are larger than C(L−5) . . . C0, then the r-values should be processed in reverse time order, i.e., moving counterclockwise around the tailbiting circle. It is also known to employ a prefilter to prefilter the received sample sequence . . . r1 . . . rn . . . to obtain a modified received sample sequence that appears to have been received through a modified channel described by modified channel coefficients. The modified channel coefficients may have any desired property, such as some large and others small, when the prefilter parameters are properly chosen.

It is also possible to initialize the tailbiting Viterbi equalizer to a starting condition comprising initial channel estimates using less than 2L−1 known symbols. Since the initial $2^{L-1}$ states each contain a hypothesis for L−1 symbols, it is required only that another L symbols be known and located before, after or among the L−1 symbols to provide a complete block of 2L−1 successive known or hypothesized symbols from which initial channel estimates can be calculated by solving L equations for each state. In this manner every state has a different set of channel estimates, as is disclosed in Gudmundson U.S. Pat. No. 5,164,961, which is hereby incorporated by reference herein. It is possible to reduce the number of known symbols required even further, to L−1, by estimating the channel only after hypothesizing another new data symbol as disclosed in U.S. patent application Ser. No. 09/426,374 to Bottomley, Dent and Lampe filed Oct. 25, 1999, which is hereby incorporated by reference herein.

Initial channel estimates made using the hypothesized symbols in each state as proposed above are not reliable channel estimates, accordingly, the channel estimates cannot sensibly now be used to demodulate the same received samples to confirm that the hypothesized symbols were correct. However, the channel estimates can be used to process new signal samples and update metrics until sample r(n) has been processed with a last symbol hypothesis Sn. At that point, the "tail" is encountered in which symbols S1 . . . S4 are used again to process r1 . . . r4 separate received sample hypotheses for which symbols may exist in the path history of different states if those symbols are not part of the L pre-agreed symbols. Thus, the final act of tailbiting comprises using the first L−1 symbols (separately selected from each state) together with the last hypothesized symbols S(n) . . . S(n−L+2) from the same state to process the first L−1 received samples to produce a final metric for the state. That state having the lowest final metric then contains the maximum likelihood result. whether the received samples r1 . . . r4 are processed as a block or one at a time, with contraction of the number of states by two if the associated "tail" symbol is a known symbol or not if it is an unknown symbol, depends on the way in which known symbols were interspersed with unknown symbols at the start of the block. The minimum number of states to which the tailbiting algorithm will taper upon encountering the tail is $2^{L-M-1}$ where m is the maximum number of known symbols that can be found in any consecutive L−1 symbols. When this minimum number of states is reached, the state having the lowest metric contains the desired result.

When the time dispersion, or ISI, extends over more symbols than can be handled by a Viterbi algorithm of reasonable complexity, a tailbiting Stack equalizer may be used instead. The Stack algorithm used by the Stack equalizer expands the number of nodes to be the same as the number of states of a Viterbi algorithm, unless a known starting state is available. Even so, not all nodes would be extended for every symbol processed, so such a Stack algorithm could still be useful. However, since it is common to include known symbols for the purpose of channel estimation, these may also be used to provide a starting state for a tailbiting Stack algorithm.

For example, assume that a block of information symbols, including a sub-block of known symbols, is transmitted over a time-dispersive channel. The information symbol block includes a cyclic repeat of the first-transmitted symbols at the end of transmission, or equivalently a cyclic repeat of the last-transmitted symbols at the beginning. The known symbol sub-block may be the symbols at the beginning and end, or may be located in the middle of the block. The known symbol sub-block preferably contains at least 2L−1 known symbols, where L is the number of symbol periods corresponding to the maximum multipath delay. This results in a number of equations containing only known symbols that is at least sufficient to solve for the L channel estimates C0 . . . C(L−1). The next equation, say the first equation in the above set, contains one unknown symbol (e.g., S1), the next equation contains two unknown symbols, and so-on. Therefore, the first equation may be used to provide an initial starting fork for a Stack algorithm by calculating the squared difference between the RHS and the LHS of the first equation for each possible value of S1 in turn. The resulting metrics are stored against an initial set of nodes corresponding to each possible value of S1. Moreover, the channel estimates can optionally be updated separately for each node on the assumption that the node's hypothesis for S1 is true. S1 is then used as an extra known symbol along with the previous known symbols to re-estimate the channel coefficients C0, C1, C2 . . . etc. An updated set of channel coefficients may optionally be stored against each node. If each node stores a separately updated channel estimate, the algorithm may be called a "Channel Model per Node" algorithm, analogous with the Channel Model per State algorithm disclosed by Gudmundson for the Viterbi equalizer.

The inventive Stack equalizer then proceeds by extending the path from the node having the metric indicative of highest probability (lowest metric value), hypothesizing all possible values of S2 to generate a further fork from the best node to date. Path extension continues until a fork is reached at which the last unknown symbol is hypothesized, for example, symbol S(n−4). Since the remaining symbols S(n−3), S(n−b 2) . . . S(n) are all known, the remaining equations not yet used may now all be used together in a burst-wise extension as previously described to complete the tailbiting circle and thereby obtain a final metric for each value of the last unknown symbol S(n−4). If one of these final metrics is still the best metric (lowest metric) of all stored metrics, possibly with an adequate margin, then the path history associated with the final metric is the desired Maximum-Likelihood Equalizing of the received signal.

When using the inventive Stack equalizer, it can be advantageous to either extend paths backward in time from the known symbol subgroup, or forward in time, depending on whether channel coefficient C(L−1) or C0 is larger. It is known in the prior art, for example in Dent U.S. Pat. No. 5,335,250, which is hereby incorporated by reference herein, that forward or backward demodulation can be advantageous using a Viterbi algorithm. Forward or backward demodulation is useful for the Viterbi algorithm when fading occurs within the signal block being processed, which, however, is not the motivation for choosing forward or backward demodulation for the inventive Stack equalizer. In the Stack equalizer, forward equalization is preferred if channel coefficient C0 is the larger channel coefficient, as this will result in the greatest effect on the metrics at the next fork causing rapid abandonment of false paths. On the other hand, if channel coefficient C(L−1) is larger, time-reversed equalization is preferred for similar reasons.

As described in U.S. patent application Ser. No. 09/378, 314 filed Aug. 20, 1999 to Zangi and Hui, it is preferred that either C0 or C(L−1) be the largest of all channel coefficients in order to reduce the complexity of a Viterbi algorithm known as MLSE-PSP (Maximum Likelihood Sequence Estimation-Per Survivor Processing). This can be ensured by pre-filtering the received signal with a properly determined prefilter. However, when tailbiting is not available, the Viterbi algorithm must equalize the signal both forward and backward in time from the known symbol subgroup. This requires the computation and application of a first prefilter for forward demodulation that makes channel coefficient C0 the largest, and the computation of a second prefilter for backward demodulation that makes channel coefficient C(L−1) the largest. In the case of a tailbiting equalizer, however, demodulation can continue in the same direction, either forward or backward, to demodulate all symbols due to the cyclic extension. Thus, only a single prefiltering operation is necessary for the tailbiting Viterbi equalizer and possibly no prefiltering at all for the Stack equalizer. Prefiltering is not excluded, however, as it is well known that prefiltering by, for example, a matched filter, or a noise-whitening filter, or both, can be advantageous in demodulating the received signal.

In the Stack equalizer as opposed to the Viterbi algorithm, metrics are compared for paths of different lengths. Unlike the Stack decoder, the branch metrics are not easily characterized as having a "zero" or "non-zero" syndrome. Thus, to give a valid comparison between paths of different lengths, a Fano type metric can be used. For example, a value can be added to the metrics that is proportional to the number of symbols a path has remaining to complete the circle. The value to be added is equal to the mean square noise level on each received sample, which can be derived during channel estimation. When the channel is initially estimated or subsequently updated using known symbols, the equations containing only known symbols are solved, and the sum of the squares of the residual errors is divided by the number of equations used to obtain an estimate of the noise per received sample value. This value is multiplied by the number symbols remaining and added to the path metric. For example, the noise estimate can be multiplied by the number of symbols in the tailbiting circle and used as the starting metric for the initial node. Thereafter, after every path extension, the noise value is subtracted so that a path metric that grows no faster than the expected noise level per sample is not prematurely abandoned. If channel coefficients are updated and the noise estimate is updated after a path extension, the original noise value times the original number of symbols remaining is subtracted before the new noise value times the new number of symbols remaining is added.

Upon completing a circle, it may be required that the final best metric is lower than the second best metric by some integral number times the noise, for example, 3–6 times, so that the chance that the best metric found could be bettered by another path is at the 3-sigma or 6-sigma level of unlikelihood. In general, the Stack equalizer does not need to be a tailbiting equalizer and can be used to decode continuous transmissions, with appropriate choice of metric, e.g., a Fano metric.

A number of new applications for, and adaptations of, the Stack Algorithm have been described above, including decoding tailbiting convolutional codes and equalizing a signal received through a dispersive medium and suffering from considerable InterSymbol Interference. For the former, a new advantageous metric was proposed, which has the property that the first complete decoding found that has a metric indicative of highest probability (lowest metric value) that all other partial decodings tested, must be the Maximum Likelihood Decoding. Other metrics already known in the prior art may be alternatively used by a person skilled in the art, without departing from the spirit or scope of this invention as described by the following claims.

I claim:

1. A method for communicating digitally coded signals, said method comprising the steps of:

grouping said digitally coded signal into symbol blocks;

error-correction coding said symbol blocks to produce coded symbol blocks for transmission;

receiving transmitted coded symbol blocks;

computing likelihood values for said symbol blocks by successively extending partial symbol blocks having a greatest associated likelihood indication and updating likelihood values associated therewith until either (a) a likelihood value for a complete symbol block is obtained, or (b) a preset processing time expires;

upon obtaining a likelihood value for a complete symbol block, reconstructing the digitally coded signal using the obtained complete symbol block; and upon the processing time expiring, reconstructing the digitally coded signal using previous or subsequently obtained complete symbol blocks.

2. The method of claim 1, wherein the digitally coded signal is a speech signal.

3. A method for decoding information signals which have been encoded by an encoder using a tailbiting error-correction codeword, said method comprising the steps of:

initializing a number of decoder states corresponding to all possible starting states of the encoder to have equal associated likelihood metrics;

receiving information signals representative of a first number of coded symbols and updating the associated likelihood metrics for each of the decoder states given the received information signals;

receiving further information signals representative of further coded symbols and extending a decoder state having a highest likelihood metric by updating the associated likelihood metric to produce new likelihood metrics for each possible hypothesized extended decoded information symbol, given the further received information signals, and appending an assumed value for the extended decoded information symbol to a symbol history for the extended decoder state;

continuing to receive further information signals and to extend the decoder state having a highest likelihood metric by hypothesizing additional information symbols to produce further extended decoder states until a last information symbol coded in a tailbiting codeword has been hypothesized;

when the last information symbol has been hypothesized, completing computation of final metrics for each of the corresponding extended decoder states by receiving and processing all remaining information signals depending on the tailbiting codeword;

determining if one of the final metrics is indicative of a highest likelihood metric of all final and partial metrics;

if one of the final metrics is indicative of the highest likelihood metric, then using the symbol history of the associated decoder state as the decoded information; and if a partial metric is indicative of a higher likelihood metric than any final metrics, then continuing to extend the decoder state associated with the partial metric of highest likelihood until either all partial metrics are indicative of lower likelihood than a best final metric, or else further final metrics are calculated at least one of which is indicative of a higher likelihood than previously obtained final metrics.

4. The method of claim 3, wherein the starting states are initialized to have zero metrics.

5. The method of claim 3, wherein the received signals are soft values from a signal demodulator.

6. The method of claim 3, wherein metric updating comprises:

predicting a received signal value based on re-encoding the symbol history associated with a decoder state using a local copy of said encoder;

comparing a received signal value with the predicted received signal value to produce a delta metric; and combining the delta metric with the previous decoder state likelihood metric to produce an updated likelihood metric.

7. The method of claim 6, wherein the delta metric is zero if a sign of the predicted received signal value matches a sign of the received signal value, and wherein if the signs do not match the delta metric is a non-zero value.

8. A Stack Decoder for decoding error-correction coded information symbols, said Stack Decoder comprising:

a receiver for receiving error correction coded information symbols and producing output signals corresponding to coded symbols;

a memory for storing a number of internal decoder states, each decoder state having an associated symbol history and a cumulative metric indicative of likelihood of probability;

processing means for successively extending by one new decoded symbol the associated symbol history of the decoder state having a metric indicative of highest likelihood and computing new metrics for the extended decoder states, said processing means comprising:

an encoder re-encoding the symbol history associated with each extended decoder state to develop a predicted signal;

a probability circuit receiving the predicted signal and the receiver output signal and adding zero to the decoder state metric to obtain a new metric for the decoder state if the predicted signal and the receiver output signal have the same sign, or adding a non-zero value to the decoder state metric to obtain a new metric for the decoder state if the predicted signal and the receiver output signal do not have the same sign; and a comparison circuit receiving the new metrics associated with each possible decoder state and choosing the decoder state having a metric indicative of highest likelihood for extension.

9. A method for decoding a received signal suffering from InterSymbol Interference (ISI), said method comprising the steps of:

estimating a number of channel coefficients indicative of the ISI using a subgroup of known symbols in the received signal;

initializing a starting state in a memory with a starting metric value;

hypothesizing a first symbol adjacent to the known symbols and combining the first hypothesized symbol with the known symbols using the estimated channel coefficients as combining weights to develop a first signal prediction;

comparing the first signal prediction with a corresponding received signal value to develop a branch metric, and combining the branch metric with the starting metric to develop a new metric associated with a new memory state;

periodically determining the state having an associated metric indicative of highest likelihood probability;

successively extending the memory state of highest likelihood probability to obtain new states by hypothesizing a next symbol in sequence;

computing metrics for the new states based on the metric of the preceding state in association with a comparison of a corresponding signal prediction with a corresponding received signal sample; and when a final metric indicative of highest likelihood probability has been calculated, using the hypothesized symbol history of the state corresponding thereto as the decoded received signal.

10. The method of claim 9, wherein the received signal comprises a block of symbols concatenated with a cyclic extension to form a cyclic block.

11. The method of claim 10, wherein decoding terminates when at least one of the memory states is extended to encompass all symbols in the cyclic block and the associated metric for the state is indicative of a likelihood greater than that of any other state by an adequate margin.

12. The method of claim 10, wherein successively hypothesized symbols correspond to instants lying in a clockwise direction away from the known symbols around the cyclic block.

13. The method of claim 10, wherein successively hypothesized symbols correspond to instants lying in a counterclockwise direction away from the known symbols around the cyclic block.

14. The method of claim 9, wherein successively hypothesized symbols correspond to time periods later than the known symbols.

15. The method of claim 9, wherein successively hypothesized symbols correspond to time periods prior to the known symbols.

16. A method of decoding cyclically extended signal segments containing a known symbol pattern and received through a multipath channel, said method comprising the steps of:

estimating channel coefficients for a multipath channel using known symbols in the received signal segments and initializing a memory to a starting state corresponding to the known symbols;

hypothesizing unknown symbols to be decoded and generating successor states branching from the starting state, each successor state having an associated likelihood metric based on the received signal and the estimated channel coefficients combined with a symbol history of the state;

continuing to process the received signal segment, in cyclic order using a cyclic extension to wrap around an end of the signal segment to a beginning of the signal segment until processing returns once more to the known symbols; and terminating decoding by processing signal samples associated with the known symbols a second time, and reducing the number of states after each known symbol is reprocessed until a single terminal state is reached containing the decoded symbols.

17. A method of decoding a received signal including cyclically extended signal segments containing a known symbol pattern and received through a multipath channel, said method comprising the steps of:

estimating channel coefficients for the multipath channel using a known symbols pattern in the received signal and initializing a memory to a starting state corresponding to the known symbols;

hypothesizing unknown symbols to be decoded and generating successor memory states branching from the starting memory state, each successor memory state having an associated stored likelihood metric based on the received signal and the estimated channel coefficients combined with a symbol history of the state;

periodically determining the successor memory state having the metric indicative of highest likelihood and continuing to process the received signal in cyclic order to develop new successor states branching from the state of highest likelihood using a cyclic extension to wrap around an end of the signal segment to a beginning of the signal segment until processing returns once more to the known symbols;

when all unknown symbols have been hypothesized, processing all remaining signal samples that depend on the unknown and known symbols to produce a final metric for the memory state; and terminating decoding if any final metric is indicative of a likelihood greater than any other state's likelihood by more than a threshold.

18. The method of claim 17, further comprising the step of:

periodically determining if any metric is indicative of lower likelihood than a final metric and, if so, deleting the state associated with the metric of lower likelihood.

* * * * *